(12) United States Patent
Campbell

(10) Patent No.: US 10,700,226 B2
(45) Date of Patent: Jun. 30, 2020

(54) OPTICALLY ACTIVATED TRANSISTOR, SWITCH, AND PHOTODIODE

(71) Applicant: BOISE STATE UNIVERSITY, Boise, ID (US)

(72) Inventor: Kristy A. Campbell, Boise, ID (US)

(73) Assignee: BOISE STATE UNIVERSITY, Boise, ID (US)

( * ) Notice: Subject to any disclaimer, the term of this patent is extended or adjusted under 35 U.S.C. 154(b) by 110 days.

(21) Appl. No.: 15/990,067

(22) Filed: May 25, 2018

(65) Prior Publication Data

US 2020/0028007 A1 Jan. 23, 2020

Related U.S. Application Data

(60) Provisional application No. 62/511,119, filed on May 25, 2017.

(51) Int. Cl.
*H01L 31/043* (2014.01)
*H01L 31/032* (2006.01)
(Continued)

(52) U.S. Cl.
CPC ...... *H01L 31/0324* (2013.01); *C23C 14/0623* (2013.01); *C23C 14/34* (2013.01);
(Continued)

(58) Field of Classification Search
CPC . H01L 45/085; H01L 45/143; H01L 45/1233; H01L 45/1266; H01L 45/1625; H01L 51/5016; H01L 45/144; H01L 51/006; H01L 51/0085; H01L 2224/48091; H01L 2251/5338; H01L 27/3244; H01L 45/1616; H01L 45/1675; H01L 31/18;
(Continued)

(56) References Cited

U.S. PATENT DOCUMENTS 6,867,996 B2 * 3/2005 Campbell .......... G11C 13/0004
257/E45.002
2001/0038367 A1 * 11/2001 Inukai .................. G09G 3/2022
345/76

(Continued)

OTHER PUBLICATIONS

Mircea Dragoman et al.; A SnS2-based photomemristor driven by sun; Journal of Applied Physics 123, 024506 Jan. 11, 2018.
(Continued)

*Primary Examiner* — William R Alexander
*Assistant Examiner* — Balram T Parbadia
(74) *Attorney, Agent, or Firm* — Parsons Behle & Latimer

(57) ABSTRACT

An optically activated device that includes an active material on a substrate with two electrodes electrically connected to the active material, the active material conducts current in the presence of light and does not conduct appreciable current in the absence of light. The optically activated device functions as a photodiode, a switch, and an optically gated transistor. The optically activated device conducts current in the presences of light. The active material may be layers of germanium selenide and germanium selenide and an element. Germanium selenide may be sputtered onto a substrate to create layers of material separated by layers of co-sputtered germanium selenide with the element. The active material may be deposited onto a flexible substrate.

19 Claims, 7 Drawing Sheets

(51) Int. Cl.
  *H01L 31/0224* (2006.01)
  *C23C 14/06* (2006.01)
  *C23C 14/34* (2006.01)
  *H01L 31/109* (2006.01)

(52) U.S. Cl.
  CPC .... *H01L 31/022408* (2013.01); *H01L 31/032* (2013.01); *H01L 31/109* (2013.01)

(58) Field of Classification Search
  CPC ..... H01L 45/141; H01L 45/142; H01L 45/16; H01L 45/1641; H01L 51/5012; H01L 51/5056; H01L 51/5064; H01L 51/5072; H01L 51/5237; H01L 51/56; H01L 2031/0344; H01L 21/02175; H01L 21/0228; H01L 27/14618; H01L 27/1463; H01L 27/14634; H01L 27/14643; H01L 31/0296; H01L 31/0304; H01L 31/0336; H01L 31/035218; H01L 31/035227; H01L 31/053; H01L 31/072; H01L 31/109; H01L 45/06; H01L 45/1253; H01L 45/146; H01L 45/1608; H01L 45/165; H01L 45/1658; H01L 51/0004; H01L 51/0026; H01L 51/0039; H01L 51/0052; H01L 51/0054; H01L 51/0065; H01L 51/0068; H01L 51/0071; H01L 51/008; H01L 51/0097; H01L 51/4206; H01L 51/4226; H01L 51/4246; H01L 51/4266; H01L 51/442; H01L 51/448; H01L 51/502; H01L 51/504; H01L 51/508; H01L 51/5088; H01L 51/5092; H01L 51/5096; H01L 51/5203; H01L 51/5206; H01L 51/5221; H01L 51/5265; H01L 51/5278; H01L 51/0072; H01L 27/1461; H01L 27/14665; H01L 27/2463; H01L 2924/00014; H01L 51/0003; H01L 51/0047; H01L 51/0058; H01L 51/0059; H01L 51/0061; H01L 51/0073; H01L 51/0074; H01L 51/0077; H01L 51/42; H01L 51/422; H01L 51/4253; H01L 2251/5353; H01L 2251/5361; H01L 2251/5384; H01L 2251/552; H01L 27/14607; H01L 27/14647; H01L 27/1467; H01L 27/286; H01L 27/307; H01L 27/3209; H01L 27/323; H01L 27/3262; H01L 27/3265; H01L 27/3281; H01L 31/022408; H01L 31/022425; H01L 31/032; H01L 31/0324; H01L 31/0224; H01L 31/042; H01L 31/043; Y02E 10/549; Y02E 10/542; Y02E 10/50; G09G 2300/0842; G09G 3/3233; G09G 3/3258; G09G 2300/0426; G09G 2300/0465; G09G 2300/0861; G09G 2300/0866; G09G 2320/0233; G09G 2320/029; G09G 2320/043; G09G 3/2018; G09G 3/2022; G09G 3/30; G09G 3/3266; G09G 3/3291; H01G 9/2045; H01G 9/2009; H01G 9/2027; H01G 9/2031; H01G 9/2059; G01J 5/28; C23C 14/0623; C23C 14/0629; C23C 14/14; C23C 14/34; C23C 14/3464; C23C 14/06
  See application file for complete search history.

(56) References Cited

U.S. PATENT DOCUMENTS

| | | | |
|---|---|---|---|
| 2002/0021266 A1* | 2/2002 | Koyama | G09G 3/3233 345/76 |
| 2002/0039044 A1* | 4/2002 | Kwak | G05F 3/262 327/540 |
| 2003/0173558 A1* | 9/2003 | Campbell | H01L 45/085 257/10 |
| 2003/0228717 A1* | 12/2003 | Li | H01L 45/085 438/95 |
| 2004/0043585 A1* | 3/2004 | Moore | H01L 27/2463 438/510 |
| 2004/0175859 A1* | 9/2004 | Campbell | G11C 13/0004 438/102 |
| 2004/0238809 A1* | 12/2004 | Adamec | H01J 1/3044 257/10 |
| 2006/0046444 A1* | 3/2006 | Campbell | H01L 45/1641 438/510 |
| 2006/0186394 A1* | 8/2006 | Campbell | H01L 45/085 257/3 |
| 2013/0306927 A1* | 11/2013 | Marsh | H01L 45/144 257/2 |
| 2013/0327377 A1* | 12/2013 | Ting | H01L 51/4246 136/255 |
| 2015/0144195 A1* | 5/2015 | Irwin | H01L 51/4266 136/260 |
| 2015/0357357 A1* | 12/2015 | Sargent | H01L 27/1467 250/208.1 |
| 2016/0035496 A1* | 2/2016 | Irwin | B05D 1/38 136/265 |
| 2017/0141330 A1* | 5/2017 | Tsunoi | C09K 11/06 |
| 2017/0179409 A1* | 6/2017 | Yamaguchi | C07F 15/0033 |
| 2017/0288155 A1* | 10/2017 | Kurihara | C07F 15/0033 |
| 2017/0373263 A1* | 12/2017 | Stubbs | H01L 51/5072 |
| 2018/0076394 A1* | 3/2018 | Kawakami | C07D 307/77 |
| 2018/0151630 A1* | 5/2018 | Yamaoka | G09G 3/3258 |
| 2018/0182961 A1* | 6/2018 | Kawakami | H01L 51/0059 |
| 2018/0182976 A1* | 6/2018 | Kurihara | H01L 51/0072 |
| 2018/0233540 A1* | 8/2018 | Saito | H01L 51/42 |
| 2018/0308998 A1* | 10/2018 | Swelm | H01L 31/035218 |

OTHER PUBLICATIONS

Tengfei Pei et al; Few-layer SnSe2 transistors with high on/off ratios; Applied Physics Letters 108, 053506 (2016) Feb. 5, 2016.
H. S. Song et al; High-performance top-gated monolayer SnS2 field-effect transistors and their integrated logic circuits; Nanoscale RSCPublishing 2013.
Hua Xu; High Responsivity and Gate Tunable Graphene-MoS 2 Hybrid Phototransistor; ResearchGate Jun. 2014.
A Abderrahmane et al; High photosensitivity few-layered MoSe2 back-gated field-effect phototransistors; IOPScience; iopscience.iop.org Aug. 20, 2014.
Yuan Huang; Hybrid quantum dot-tin disulfide field-effect transistors with improved photocurrent and spectral responsivity; Applied Physics Letters 108, 123502 (2016) Mar. 24, 2016.
Bablu Mukherjee; NIR Schottky Photodetectors Based on Individual Single-Crystalline GeSe Nanosheet; ACS Applied Materials & Interfaces; www.acsami.org Sep. 12, 2013.
Lin Tao et al; N-Channel and P-channel few-layer InSe photoelectric devices; Rsc Advances RSC Adv., 2017, 7, 49694 Oct. 25, 2017.

* cited by examiner

OPTICALLY ACTIVATED TRANSISTOR, SWITCH, AND PHOTODIODE

CROSS-REFERENCE TO RELATED APPLICATIONS

This application claims priority to and the benefit of U.S. Provisional Patent Application Ser. No. 62/511,119 filed on May 25, 2017, and entitled "Optically Activated Transistor, Switch, and Photodiode," the contents of which are hereby incorporated by reference herein in their entirety.

GOVERNMENT LICENSE RIGHTS

The invention disclosed herein was funded in-part or in-whole by the U.S. Air Force Research Laboratory under Contract No. FA8750-16-C-0183. The government has certain rights in the invention disclosed herein.

BACKGROUND

Field of the Disclosure

The embodiments described herein relate to apparatuses that conduct current bi-directionally in the presence of light, methods of conducting current bi-directionally in the presence of light, and methods of providing such apparatuses.

Description of the Related Art

A photodiode is a device that generates current in the presence of light. The photodiode generates the electrical current when photons are absorbed in the photodiode material. Photodiodes often are comprised of silicon, germanium, indium gallium arsenide, lead (II) sulfide, or mercury cadmium telluride. One example of a photodiode is a solar cell that is used to generate electric solar power. Photodiodes do not exhibit the electrical characteristics of transistors.

A transistor is a device having at least three terminals that may be used to amplify or switch electronic signals. A field-effect transistor (FET) is a transistor that uses an electric field to control the electrical behavior of the transistor. A FET includes a source terminal, a drain terminal, a gate terminal, and a body, which may be considered a fourth terminal. A FET uses an electric field at the gate terminal to change the conductivity between the source terminal and the drain terminal. Because a FET relies on a voltage applied to a gate terminal for its operation, a FET may not be usable in some applications where a gate signal takes a form other than voltage. One example of a FET is a metal-oxide-semiconductor field-effect transistor (MOSFET).

SUMMARY

The present disclosure is directed to methods, apparatus, and systems that address at least some of the problems and disadvantages discussed above. It would be beneficial to provide a device that may be optically activated that may be used as a transistor, switch, and a photodiode. The disclosed device can act as a transistor without the need for a third (gate) terminal and additional voltage. It may allow direct interfacing between an electrical and optical circuit without the need of added hardware such as optical/electrical converters and other switching circuits.

One embodiment is an optically activated device that comprises an active material deposited onto a substrate. The device includes a first electrode, also referred to as a first terminal, and a second electrode, also referred to as a second terminal, that are electrically connected to the active material. The active material conducts current in the presence of light, but only conducts a very small amount of current in the absence of light, the current being non-appreciable for typical transistor, switch, and diode applications. The optically activated device may be used to electrically isolate a portion of circuitry that may be optically activated. Thus, the optically activated device may function as an optical switch. Further, because the optically activated device conducts current in the presence of light the device may function as a photodiode. Additionally, the device may function as an optically activated transistor. Beneficially, the device may function as a transistor with only two terminals as opposed to conventional transistors that require three terminals.

The amount of current conducted by the optically activated device may be dependent on the intensity of light directed to the device. The amount of current conducted by the optically activated device may be dependent on the wavelength of light directed to the device. The device may include two electrodes. The electrodes may be spaced between 10 micrometers and 100 micrometers apart. However, this spacing is not to be considered as limiting. In some embodiments, the electrodes may be spaced less than one micrometer apart. The effect that light has on the current may be dependent on the spacing of the electrodes with wider spacing being associated with a greater increase in current. The device may exhibit a current-voltage (IV) curve with operating regions similar to conventional FETs including at least a linear region and a saturation region.

The optically activated device may comprises a first layer comprised of germanium selenide (GeSe), a second layer comprised of GeSe and an element. The term element as used herein means an atom or a molecule. For example, the element may include tin, aluminum, and/or carbon. The device may include a third layer comprised of GeSe, a fourth layer comprised of GeSe and the element, and a fifth layer comprises of GeSe. Specifically, the GeSe may be $Ge_2Se_3$. The active material may be flexible permitting the active material to be deposited on a flexible substrate such as plastic or fabric, which would permit the device to still function as an optically activated switch, photodiode, or transistor while being bent. The substrate may comprise p-type silicon with a native oxide layer.

One embodiment is a method of providing an optically activated device comprising forming a first layer by depositing GeSe onto a substrate and forming a second layer by depositing GeSe and an element. The method includes forming a third layer by depositing GeSe onto the second layer and forming a fourth layer by depositing GeSe and the element onto the third layer. The method includes forming a fifth layer by depositing GeSe onto the fourth layer. The method may include electrically connecting two terminals to the optically activated device. The first layer may be formed by sputtering GeSe to form a first layer having a thickness of approximately 100 angstroms. The second layer may be formed by co-sputtering GeSe and the element to form a second layer having a thickness of approximately 10 angstroms to 30 angstroms. The third layer may be formed by sputtering GeSe to form a third layer having a thickness of approximately 100 angstroms. The fourth layer may be formed by co-sputtering GeSe with the element to form a fourth layer having a thickness of approximately 10 angstroms to 30 angstroms. The fifth layer may be formed by sputtering GeSe to form a fifth layer having a thickness of approximately 100 angstroms. As used herein, the term approximately means within industry standards for manufacturing and fabrication variance. For example, the described thickness measurements may be within 10% of the disclosed values.

Figure 1:
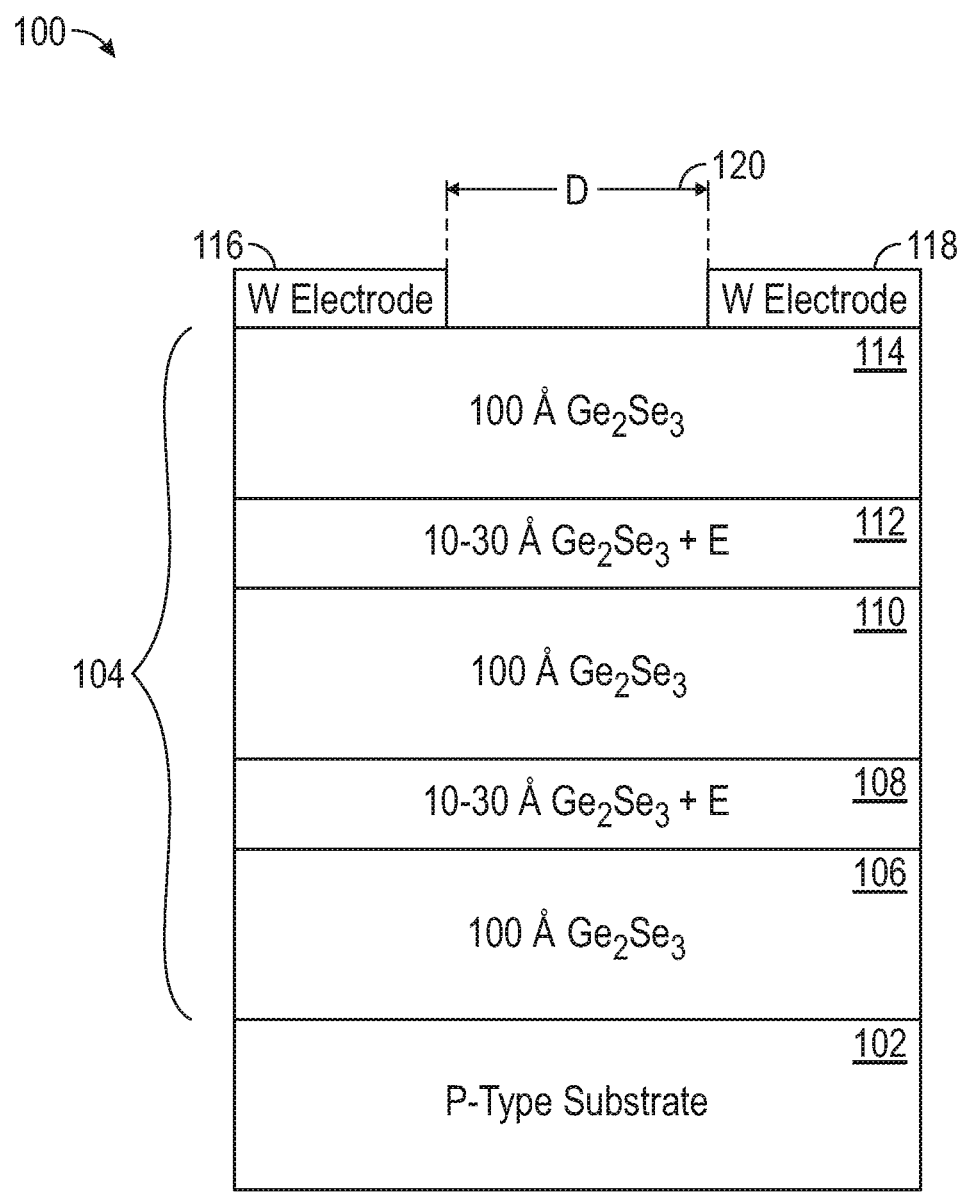
FIG. 1 depicts a block diagram of an embodiment of a device having an active material that conducts current in the presence of light.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

FIG. 1 shows a block diagram of an optically activated device 100. The device 100 may include active material 104 deposited onto a substrate 102. The substrate may include doped silicon. In particular, the substrate may include a p-type silicon substrate. While an n-type substrate may also be contemplated, a p-type silicon substrate was shown to exhibit transistor properties as described herein.

The p-type silicon substrate may further include a native oxide layer (not shown). While other coatings of the p-type silicon substrate are also contemplated, the native oxide layer was shown to exhibit desirable transistor properties. In some embodiments, the substrate may be flexible. Other substrates are also contemplated as would be appreciated by one of ordinary skill in the art having the benefit of this disclosure.

The active material 104 may include various layers 106, 108, 110, 112, 114. The first layer 106 may include GeSe alone without the addition of other elements. The first layer 106 may have a thickness of approximately 100 angstroms, which may be formed by sputtering GeSe. The second layer 108 may include GeSe and an element. Examples of elements that may be used include Sn, Al, and C. In some embodiments, both carbon and a metal may be used, with the carbon narrowing the current response of the device. The second layer 108 may have a thickness of approximately 10 angstroms to 30 angstroms, which may be formed by co-sputtering the element with GeSe onto the first layer 106. The third layer 110 may include GeSe alone. The third layer 110 may have a thickness of approximately 100 angstroms, which may be formed by sputtering GeSe. The fourth layer 112 may include GeSe and an element. The fourth layer 112 may have a thickness of approximately 10 angstroms to 30 angstroms, which may be formed by co-sputtering GeSe and the element onto the third layer 110. The fifth layer 114 may include GeSe alone. The fifth layer 114 may have a thickness of approximately 100 angstroms, which may be formed by sputtering GeSe.

The active material 104 may include various layers comprised of GeSe and various layers comprised of GeSe and an element. The layers 106, 108, 110, 112, 114 are shown for illustrative purposes only as would be appreciated by one of ordinary skill in the art having the benefit of this disclosure. The thicknesses of the layers 106, 108, 110, 112, 114 of the active material 104 are shown for illustrative purposes only may be varied depending on the application as would be appreciated by one of ordinary skill having the benefit of this disclosure.

The optically activated device 100 may include two terminals, or electrodes, 116, 118 connected to the active material 104. Advantageously, the optically activated device 100 only requires two terminals 116, 118 to function as a transistor as opposed to the three terminals required of traditional FET devices. The terminals 116, 118 may be separated by a distance D 120. A larger distance D 120 may produce a greater response, in terms of electrical conductivity, when in the presence of light. The distance D 120 may range from 10 micrometers to 100 micrometers. This spacing is not to be considered as limiting. For example, some of the tests described herein used ranges on the order of 7 millimeters. In some embodiments, the distance D 120 may be between one micrometer and 10 millimeters, or even lower than one micrometer.

During operation, the optically activated device 100 may be activated by the application of light to the active material 104. The optical activation of the device 100 permits the device to be used to electrically isolate a portion, or portions, of a circuit (not shown) coupled to the electrodes 116, 118. The application of light may switch on the device 100 to electrically connect an isolated portion of the circuit to the rest of the circuit as would be appreciated by one of ordinary skill in the art having the benefit of this disclosure.

Figure 2:
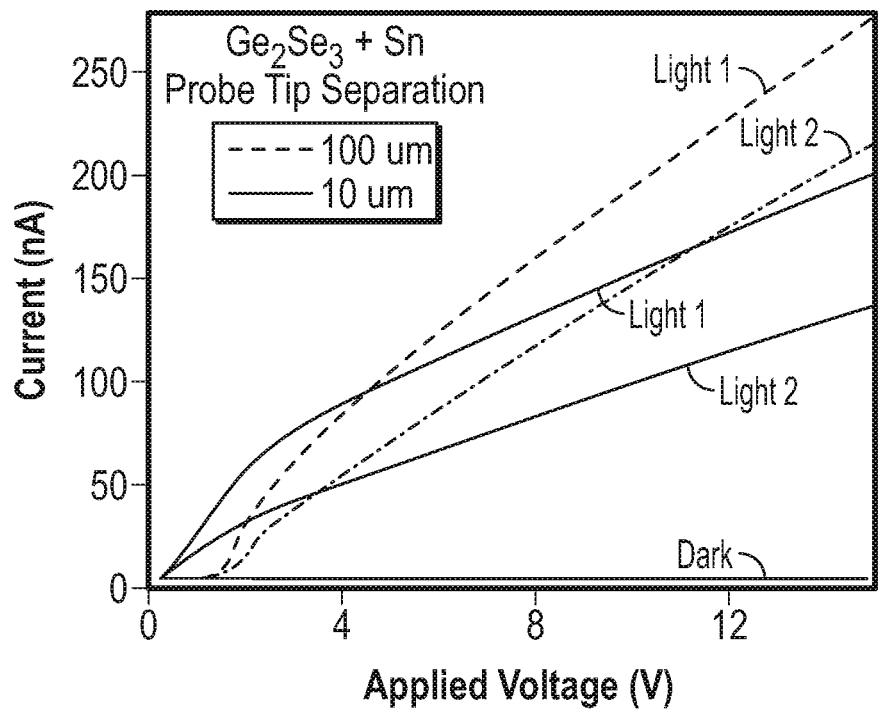
FIG. 2 is a graph depicting the effect of electrode spacing on an active material usable with an embodiment of the disclosed device.

FIG. 2 is a graph showing the effect a distance between probes on an optically activated material. In order to generate the graph depicted in FIG. 2, a layer of $Ge_2Se_3$ and Sn was prepared on a p-type substrate. Probe tips were attached at 10 micrometers while an incandescent light was used to apply two different levels of light, labeled Light 1 and Light 2, with Light 1 being more intense than Light 2. Another measurement was taken with the light turned away, labeled Dark. In each light state, a 0V to 15V voltage sweep was conducted. The process was also performed with the probes being 100 micrometers apart. As shown in FIG. 2, in each case more intense light produces more current and a steeper IV curve. Further, positioning the probes further apart creates a more pronounced light effect, meaning the device 100 has a steeper IV curve with a lower current response at voltages between approximately 0V and 4V and a higher current response at voltages above 4V.

While the test depicted in FIG. 2 was performed using probes, as opposed to electrodes fabricated on the material, the data shows that the optically activated material may behave as an optically gated transistor. Further, a wider separation between the probes results in a more pronounced transistor effect up to a certain limit. The optically activated material may behave as a photodiode or photovoltaic device as it conducts current upon the application of light. However, the optically activated material disclosed herein conducts current bidirectionally, which differs from the behavior of photodiodes and photovoltaic devices. As used herein, bidirectionally is not intended to mean that current is conducted in a symmetrical pattern. Rather, bidirectionally means that current may flow in either direction between terminals depending on a voltage applied to each terminal. The optically activated material disclosed herein may be used as an optically activated switch. The optically activated material also differs as an optically gated transistor based on the intensity of light applied to the device.

FIGS. 3, 4, 5, and 6 are graphs depicting light responses associated with various types of active material usable with device 100. In each case, blanket material deposited on a substrate was tested with probes spaced approximately 10 micrometers apart. An incandescent light was used to apply two different levels of light, labeled Light 1 and Light 2, with Light 1 being more intense than Light 2. Another measurement was taken with the light turned away, labeled Dark. In each light state, a 0V to 15V voltage sweep was conducted.

Figure 3:
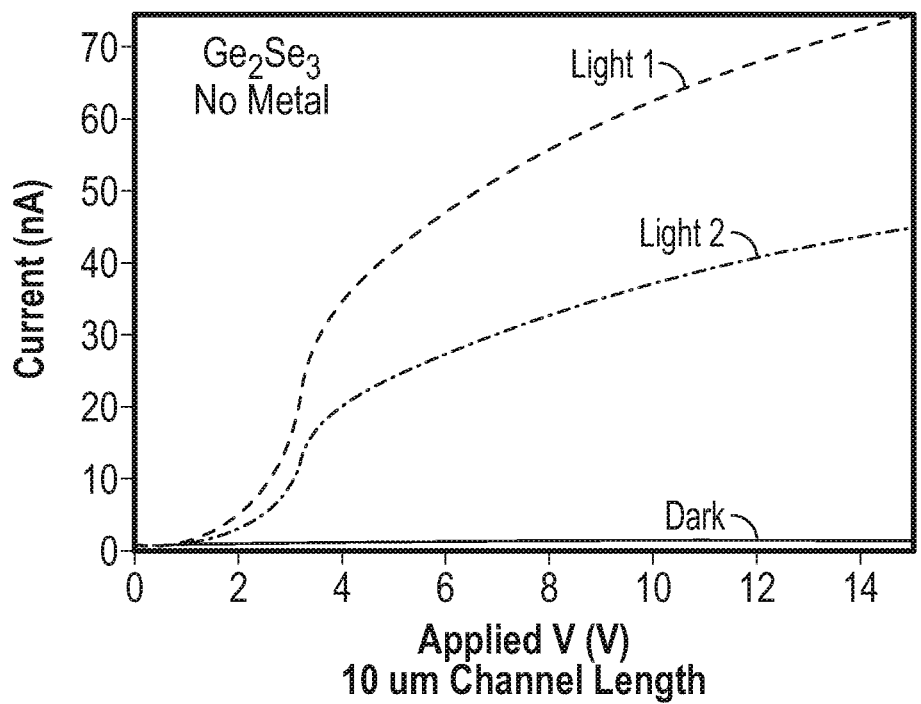
FIG. 3 is a graph depicting test data associated with $Ge_2Se_3$ in the presence of light.
Figure 4:
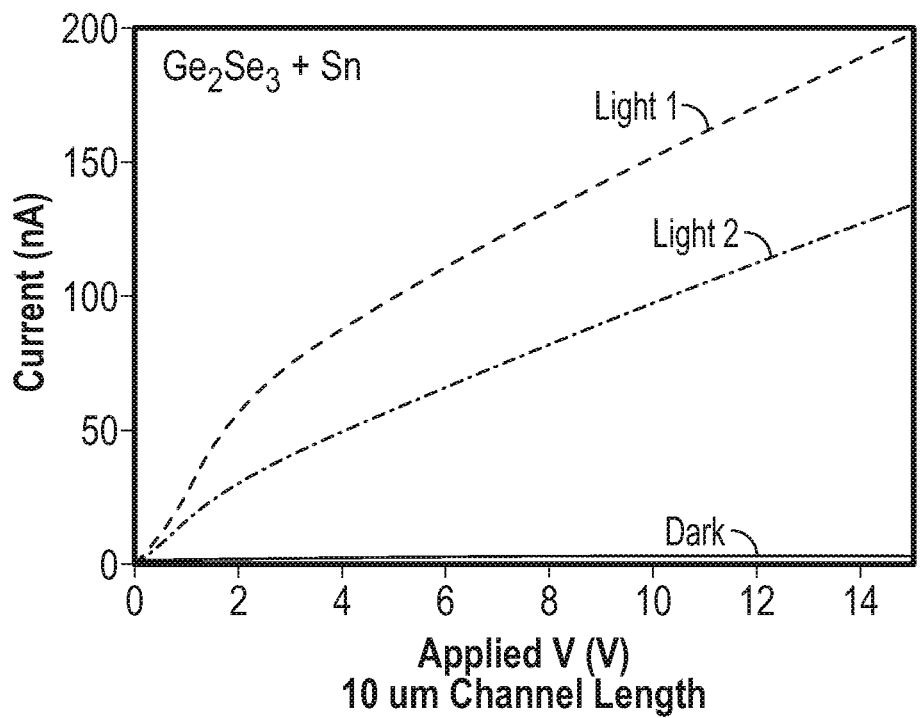
FIG. 4 is a graph depicting test data associated with $Ge_2Se_3$ and tin (Sn) in the presence of light.
Figure 5:
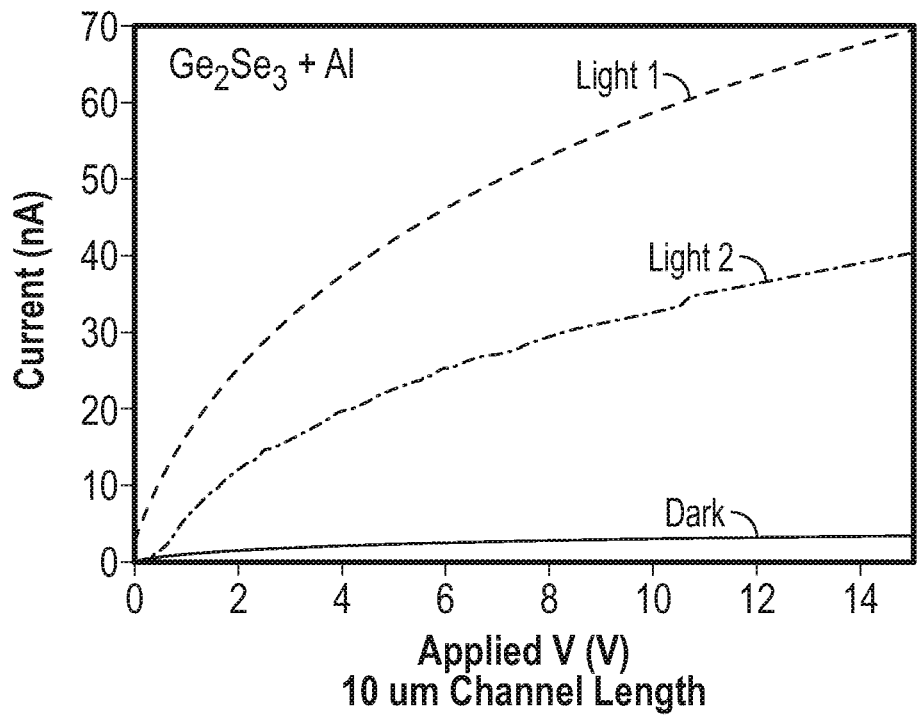
FIG. 5 is a graph depicting test data associated with $Ge_2Se_3$ and aluminum (Al) in the presence of light.
Figure 6:
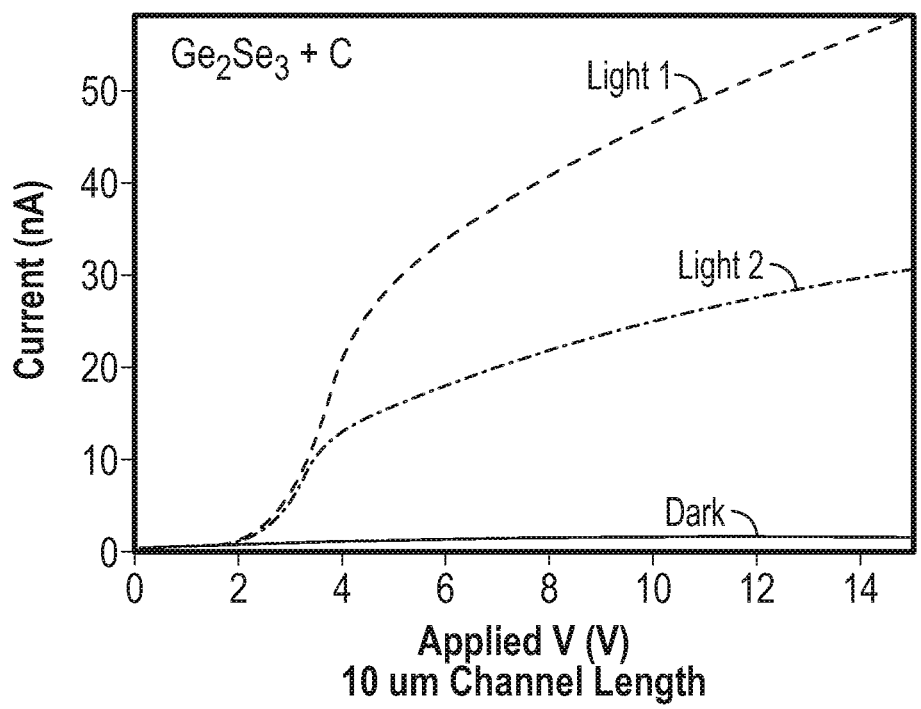
FIG. 6 is a graph depicting test data associate with $Ge_2Se_3$ and carbon (C) in the presence of light.

FIG. 3 depicts a light response associated with $Ge_2Se_3$ alone in the presence of light. As shown in FIG. 3, the $Ge_2Se_3$ alone begins to exhibit a current in the presence of light at about 3V with the current level rising to about 75 nanoamperes for the Light 1 intensity level and to about 45 nanoamperes for the Light 2 intensity level. FIG. 4 depicts a light response associated with $Ge_2Se_3$ and Sn in the presence of light. As shown in FIG. 4, the $Ge_2Se_3$ with the Sn begins to exhibit a current in the presence of light at less than 2V with the current level rising to about 200 nanoamperes for the Light 1 intensity level and to about 130 nanoamperes for the Light 2 intensity level. FIG. 5 depicts a light response associated with $Ge_2Se_3$ and Al in the presence of light. As shown in FIG. 5, the $Ge_2Se_3$ with the Al begins to exhibit a current in the presence of light at less than 1V with the current level rising to about 70 nanoamperes for the Light 1 intensity level and to about 40 nanoamperes for the Light 2 intensity level. FIG. 6 depicts a light response associated with $Ge_2Se_3$ and C in the presence of light. As shown in FIG. 6, the $Ge_2Se_3$ with the C begins to exhibit a current in the presence of light at about 3V with the current level rising to about 60 nanoamperes for the Light 1 intensity level and to about 30 nanoamperes for the Light 2 intensity level.

In each of FIGS. 3-6, the IV curves somewhat conform to transistor IV curves having multiple regions, or operating modes. The regions are more pronounced in devices having structures that conform more substantially to the active optical device 100, as described with reference to FIGS. 7-10. Further, as seen in FIGS. 3-6, materials with $Ge_2Se_3$ and Sn or Al produce the highest light response as compared to materials with $Ge_2Se_3$ alone. Sn and Al also appear to be more effective than other metals, such as chromium (Cr), tungsten (W), titanium (Ti), and copper (Cu). However, Cr, W, Ti, and Cu may also be used as an element in the disclosed device. As shown in FIG. 6, the light response may be reduced in materials with $Ge_2Se_3$ and C compared to the $Ge_2Se_3$ control of FIG. 3.

FIGS. 7, 8, 9, and 10 are graphs depicting IV curves for the device 100 using different materials as the element. In each of FIGS. 7-10, the device 100 was formed using different elements in the active material 104. Multiple levels of incandescent light (i.e., Light 1, Light 2, Light 3) were applied to each device. A voltage sweep between 0V to 15V was performed at each of the levels of light for each device. Further, a voltage sweep was performed in the absence of light.

Figure 7:
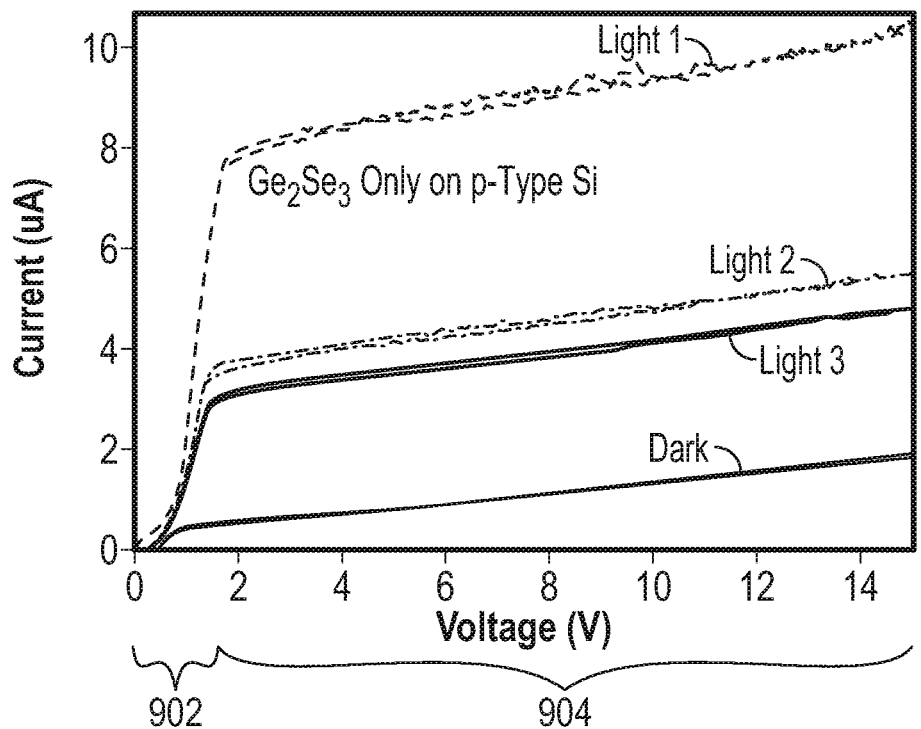
FIG. 7 is a graph depicting IV curves exhibited by an embodiment of the disclosed device including $Ge_2Se_3$ only.
Figure 8:
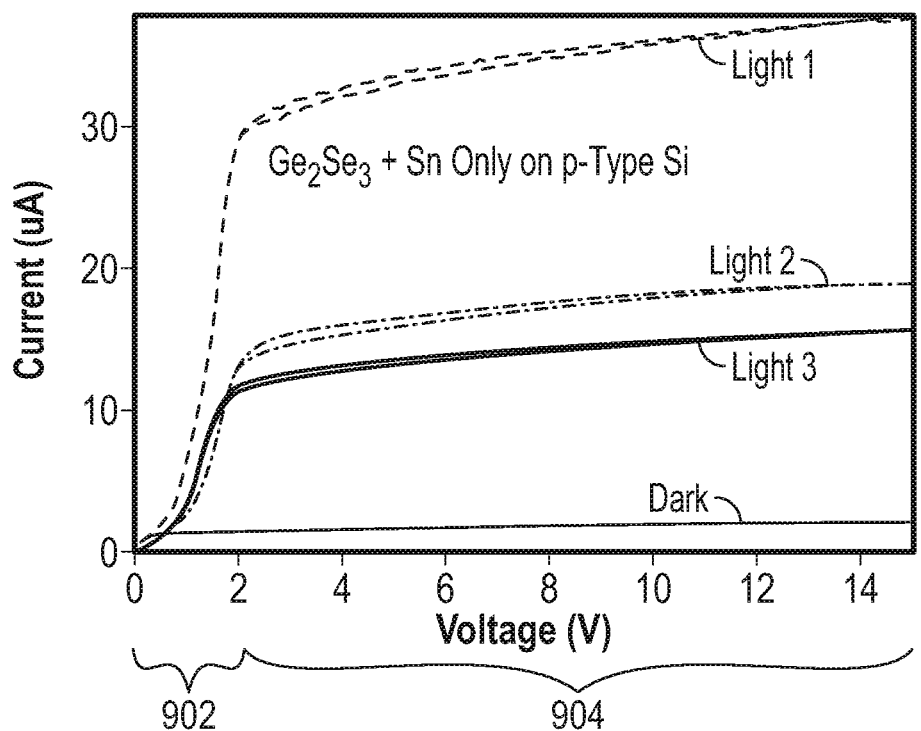
FIG. 8 is a graph depicting IV curves exhibited by an embodiment of the disclosed device including $Ge_2Se_3$ and Sn.
Figure 9:
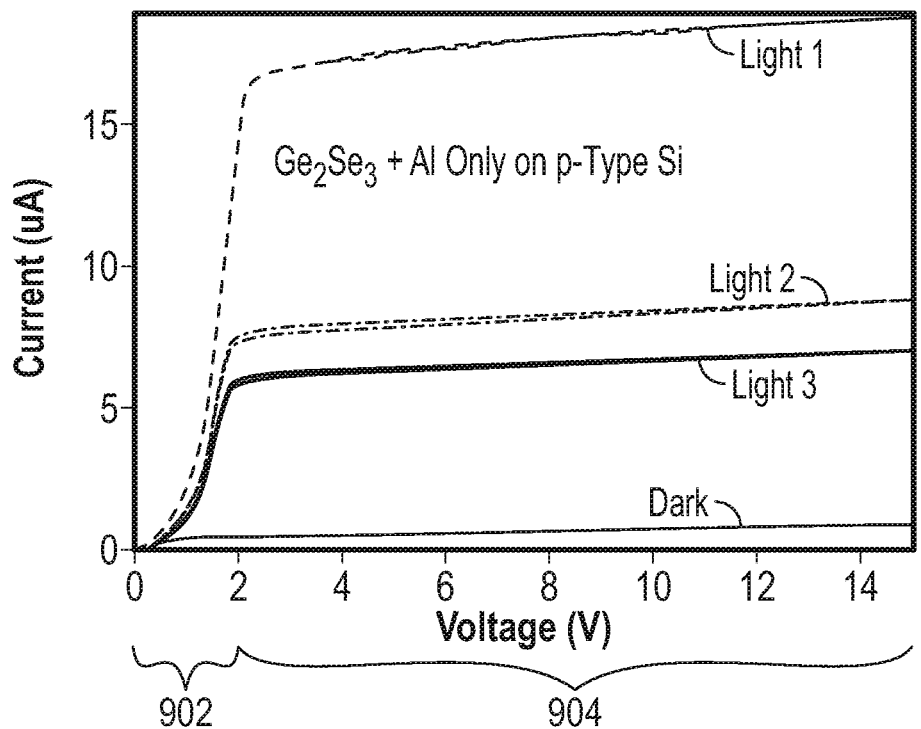
FIG. 9 is a graph depicting IV curves exhibited by an embodiment of the disclosed device including $Ge_2Se_3$ and Al.
Figure 10:
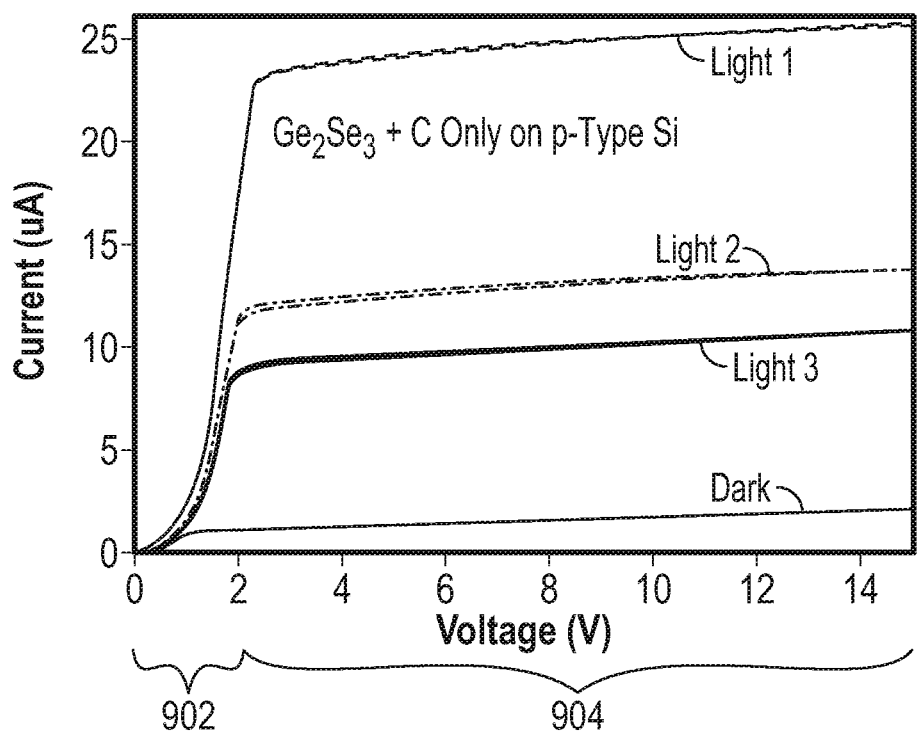
FIG. 10 is a graph depicting IV curves exhibited by an embodiment of the disclosed device including $Ge_2Se_3$ and C.

FIG. 7 depicts IV curves associated with $Ge_2Se_3$ alone at multiple levels of light intensity. As shown in FIG. 7, a linear region 902 and a saturation region 904 are exhibited. The linear region 902 occurs approximately between 0V and 2V. The saturation current for the maximum intensity of light, Light 1, is between 8 and 10 microamps, and decreases as the intensity of light decreases. FIG. 8 depicts IV curves associated with $Ge_2Se_3$ and Sn at multiple levels of light intensity. As shown in FIG. 8, the linear region 902 occurs approximately between 0V and 2V. The saturation current for the maximum intensity of light, Light 1, is between 30 and 40 microamps, and decreases as the intensity of light decreases. FIG. 9 depicts IV curves associated with $Ge_2Se_3$ and Al at multiple levels of light intensity. As shown in FIG. 9, the linear region 902 occurs approximately between 0V and 2V. The saturation current for the maximum intensity of light, Light 1, is between 15 and 18 microamps, and decreases as the intensity of light decreases. FIG. 10 depicts IV curves associated with $Ge_2Se_3$ and C at multiple levels of light intensity. As shown in FIG. 10, the linear region 902 occurs approximately between 0V and 2V. The saturation current for the maximum intensity of light, Light 1, is between 23 and 25 microamps, and decreases as the intensity of light decreases.

As can be seen in each of FIGS. 8-10, the optically activated device 100 may operate as a transistor. For example, the optically activated device 100 may exhibit an IV curve that includes at least a linear region 902 and a saturation region 904. At low levels of light, the current may further be cutoff. As such, the device 100 may include a cut-off mode, an active mode, and a saturation mode similar to voltage gated transistors. Further, the IV curves all have a sharp transition, which is desirable for use as a transistor.

Figure 11:
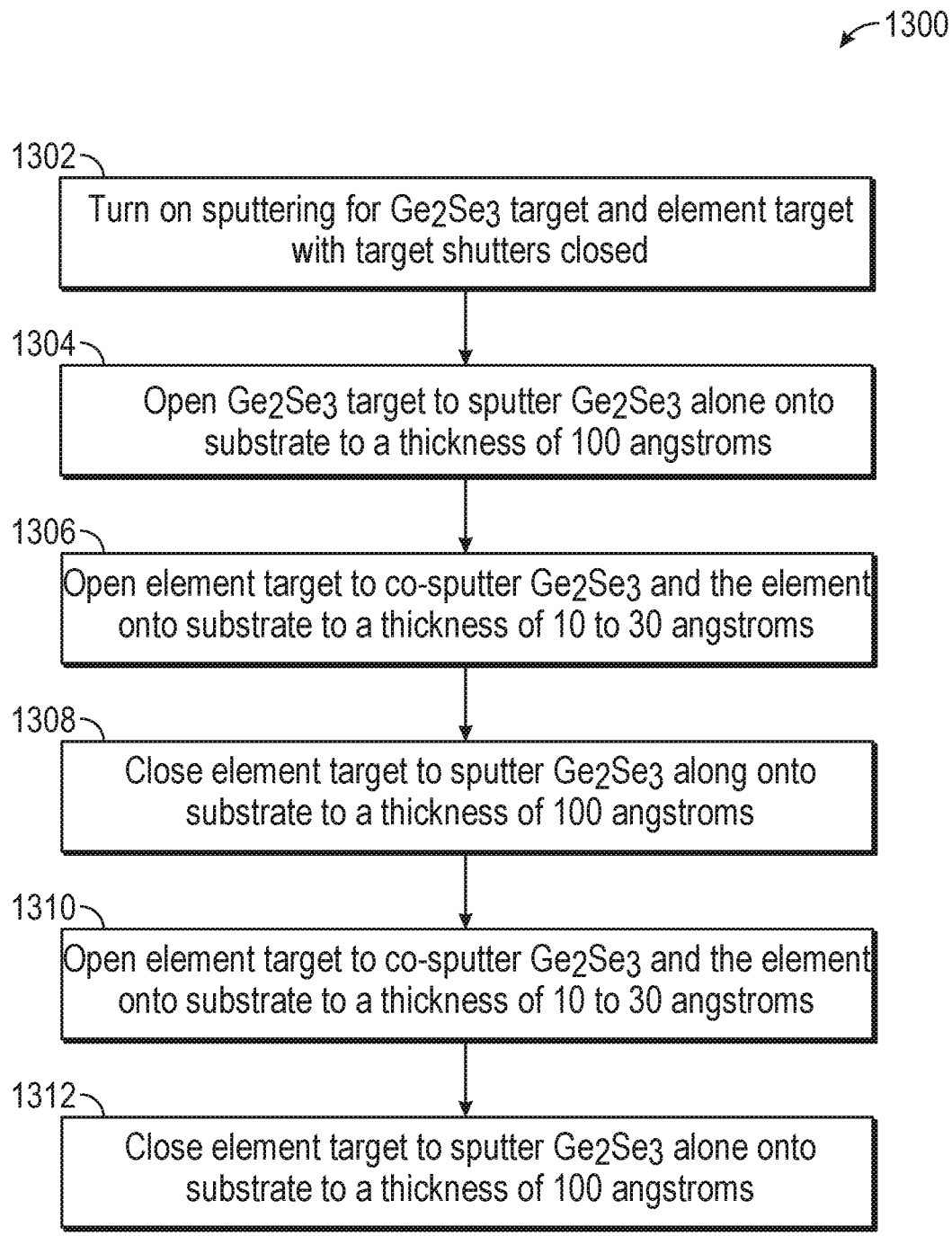
FIG. 11 is a flow chart depicting one embodiment of a method of producing a device that conducts current in the presence of light.

FIG. 11 is a flow chart for an embodiment of a method 1300 of providing an optically activated device. The method 1300 may include turning on a $Ge_2Se_3$ target to sputter $Ge_2Se_3$ and turning on an element target to sputter an element, at 1302. However, the shutters for both the $Ge_2Se_3$ and the element are closed during step 1302 so the material is not sputtered onto a substrate.

A shutter for the $Ge_2Se_3$ may be opened, at 1304, to permit the $Ge_2Se_3$ to be sputtered alone on the substrate to form a layer with a thickness of about 100 angstroms. This may form the first layer 106 on the substrate 102.

At 1306, the shutter for the element may be opened permitting the $Ge_2Se_3$ to be co-sputtered with the element onto the substrate to form a layer with a thickness of about 10 to 30 angstroms. This may result in the formation of the second layer 108.

The shutter for the element may again be closed so that $Ge_2Se_3$ may be sputtered alone onto the substrate, at 1308, to form a layer with a thickness of about 100 angstroms. This may result in the formation of the third layer 110.

At 1310, the shutter for the element may be opened permitting the $Ge_2Se_3$ to be co-sputtered with the element onto the substrate to form a layer with a thickness of about 10 to 20 angstroms. This may result in the formation of the fourth layer 112.

The shutter for the element may again be closed so that Ge$_2$Se$_3$ may be sputtered alone onto the substrate, at 1312, to form a layer with a thickness of about 100 angstroms. This may result in the formation of the fifth layer 114.

After the method 1300 is performed, both of the shutters may be closed and/or the sputtering targets are turned off. The method 1300 provides an active material on a substrate that is an optically activated device as discussed herein. The thickness of the sputtered material are for illustrative purposes and may be varied depending on the application as would be appreciated by one of ordinary skill in the art having the benefit of this disclosure. Further, the method 1300 may include additional steps sputtering Ge$_2$Se$_3$ and co-sputtering Ge$_2$Se$_3$ and the element onto the substrate depending on the application. The power of the element target is selected so that when co-sputtering Ge$_2$Se$_3$ and the element onto the substrate the Ge$_2$Se$_3$ is doped with the element.

Although this disclosure has been described in terms of certain preferred embodiments, other embodiments that are apparent to those of ordinary skill in the art, including embodiments that do not provide all of the features and advantages set forth herein, are also within the scope of this disclosure. Accordingly, the scope of the present disclosure is defined only by reference to the appended claims and equivalents thereof.

What is claimed is:

1. An optically activated device comprising:
an active material on a substrate;
a first electrode electrically connected to the active material; and
a second electrode electrically connected to the active material, wherein the active material conducts current bidirectionally in the presence of light and wherein the active material does not conduct appreciable current in the absence of light, wherein the optically active device exhibits a current-voltage curve with operating regions that include at least a linear region and a saturation region.

2. The optically activated device of claim 1, wherein an amount of current conducted by the active material is dependent on an intensity of the light.

3. The optically activated device of claim 2, wherein the optically activate device comprises no more than two electrodes in contact with the active material.

4. The optically activated device of claim 3, wherein the two electrodes are spaced between 1 micrometer and 10 millimeters apart on a surface of the active material.

5. The optically activated device of claim 1, wherein the active material comprises:
a layer comprising germanium selenide (GeSe).

6. The optically activated device of claim 1, wherein the active material comprises:
a first layer comprising germanium selenide (GeSe); and
a second layer comprising germanium GeSe and an element.

7. The optically activated device of claim 1, wherein the active material comprises:
a first layer comprising germanium selenide (GeSe);
a second layer comprising GeSe and an element;
a third layer comprising GeSe, wherein the second layer is positioned between the first layer and the third layer;
a fourth layer comprising GeSe and the element, wherein the third layer is positioned between the second layer and the fourth layer; and
a fifth layer comprising GeSe, wherein the fourth layer is positioned between the third layer and the fifth layer.

8. The optically activated device of claim 7, the first layer having a thickness of approximately 100 angstroms, the second layer having a thickness of approximately 10 angstroms to 30 angstroms, the third layer having a thickness of approximately 100 angstroms, the fourth layer having a thickness of approximately 10 angstroms to 30 angstroms, and the fifth layer having a thickness of approximately 100 angstroms.

9. The optically activated device of claim 7, wherein the GeSe further comprises Ge$_2$Se$_3$.

10. The optically activated device of claim 7, wherein the element comprises tin (Sn), aluminum (Al), carbon (C), Chromium (Cr), Tungsten (W), Titanium (Ti), or copper (Cu).

11. The optically activated device of claim 1, wherein the active material is flexible.

12. The optically activated device of claim 1, wherein the substrate includes a p-type silicon substrate.

13. A method of providing an optically activated device comprising:
forming a first layer by depositing germanium selenide (GeSe) onto a substrate;
forming a second layer by depositing GeSe and an element onto the first layer, wherein forming the second layer further comprises co-sputtering the GeSe and the element, the second layer having a thickness of approximately 10 to 30 angstroms;
forming a third layer by depositing GeSe onto the second layer;
forming a fourth layer by depositing GeSe and the element onto the fourth third layer; and
forming a fifth layer by depositing GeSe onto the fourth layer.

14. The method of claim 13, electrically connecting only two terminals to the fifth layer of the optically activated device.

15. The method of claim 13, wherein forming the first layer further comprises sputtering the GeSe, the first layer having a thickness of approximately 100 angstroms.

16. The method of claim 13, wherein forming the third layer further comprises sputtering the GeSe, the third layer having a thickness of approximately 100 angstroms.

17. The method of claim 13, wherein forming the fourth layer further comprises co-sputtering GeSe and the element, the fourth layer having a thickness of approximately 10 to 30 angstroms.

18. The method of claim 13, wherein forming the fifth layer further comprises sputtering the GeSe, the fifth layer having a thickness of approximately 100 angstroms.

19. An optically activated device comprising:
a p-type silicon substrate comprising a native oxide layer;
a first layer comprising germanium selenide (GeSe) deposited on the p-type silicon substrate;
a second layer comprising GeSe and an element deposited on the first layer;
a third layer comprising GeSe deposited on the second layer;
a fourth layer comprising GeSe and the element deposited on the third layer;
a fifth layer comprising GeSe deposited on the fourth layer;
a first electrode in contact with the fifth layer; and
a second electrode in contact with the fifth layer, wherein the combination of the substrate, the first layer, the second layer, the third layer, the fourth layer, and the fifth layer conducts current between the first electrode and the second electrode in the presence of light and does not conduct appreciable current in the absence of light, and wherein no more than two electrodes are in contact with the fifth layer, wherein the optically active device exhibits a current-voltage curve with operating regions that include at least a linear region and a saturation region.

\* \* \* \* \*